(12) United States Patent
Miyamoto et al.

(10) Patent No.: US 11,043,964 B2
(45) Date of Patent: Jun. 22, 2021

(54) MEMORY SYSTEM, PACKET PROTECTION CIRCUIT, AND CRC CALCULATION METHOD

(71) Applicant: KIOXIA CORPORATION, Tokyo (JP)

(72) Inventors: Yukimasa Miyamoto, Kanagawa (JP); Daisuke Taki, Kanagawa (JP); Takeshi Kumagaya, Tokyo (JP); Tomoya Horiguchi, Tokyo (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 16/805,098

(22) Filed: Feb. 28, 2020

(65) Prior Publication Data

US 2021/0075441 A1    Mar. 11, 2021

(30) Foreign Application Priority Data

Sep. 5, 2019  (JP) .............................. JP2019-162157

(51) Int. Cl.
*H03M 13/00*    (2006.01)
*H03M 13/09*    (2006.01)
*H03M 13/29*    (2006.01)

(52) U.S. Cl.
CPC ....... *H03M 13/091* (2013.01); *H03M 13/098* (2013.01); *H03M 13/2906* (2013.01); *H03M 13/2945* (2013.01)

(58) Field of Classification Search
None
See application file for complete search history.

(56) References Cited

U.S. PATENT DOCUMENTS

| 6,357,032 | B1 | 3/2002 | Plotz et al. | |
| 6,934,902 | B2* | 8/2005 | Hara | H03M 13/091 |
| | | | | 714/757 |
| 7,191,383 | B2 | 3/2007 | Lin et al. | |
| 7,290,196 | B1* | 10/2007 | Annayya | H03M 13/091 |
| | | | | 714/758 |
| 7,363,573 | B1* | 4/2008 | Bataineh | H03M 13/09 |
| | | | | 714/758 |
| 7,590,916 | B2* | 9/2009 | Katashita | H03M 13/091 |
| | | | | 714/757 |
| 8,321,659 | B2 | 11/2012 | Haneda | |
| 9,143,276 | B2* | 9/2015 | Zhou | H04L 1/0061 |
| 10,790,852 | B2* | 9/2020 | Kalam | H03M 13/6502 |

* cited by examiner

*Primary Examiner* — Guerrier Merant
(74) *Attorney, Agent, or Firm* — Kim & Stewart LLP

(57) ABSTRACT

A memory system includes a packet protection circuit. The packet protection circuit includes a plurality of first CRC calculation circuits, each configured to calculate a CRC of M-byte data, where M is an integer greater than or equal to 1 and less than N, where N is an integer greater than or equal to 2, a first selector configured to output a CRC calculation result of one of the first CRC calculation circuits, and a second CRC calculation circuit configured to calculate a CRC of L-byte data, where L<N, where L=N×Z, and Z is an integer greater than 1, and add the CRC of L-byte data to the CRC calculation result output from the first selector to generate a first CRC that is compared with a second CRC to detect an error in a data packet transmitted between the host interface unit and the host device.

20 Claims, 9 Drawing Sheets

MEMORY SYSTEM, PACKET PROTECTION CIRCUIT, AND CRC CALCULATION METHOD

CROSS-REFERENCE TO RELATED APPLICATION(S)

This application is based upon and claims the benefit of priority from Japanese Patent Application No. 2019-162157, filed Sep. 5, 2019, the entire contents of which are incorporated herein by reference.

FIELD

Embodiments described herein relate generally to a memory system, a packet protection circuit, and a CRC calculation method.

BACKGROUND

A cyclic redundancy check (CRC) is widely used as a method for detecting errors that occur during data transfer. For example, in a Gen-Z standard which is a standard for a communication interface, two types of CRC are defined: a prelude CRC (PCRC) for protecting a part of a packet header, and an end-to-end CRC (ECRC) for protecting the entire packet. In addition, it is defined in the Gen-Z standard that a packet size is a multiple of 4 bytes, and that the ECRC is a 24-bit (3-byte) CRC and is disposed at an end of the packet.

CRC (or CRC value) calculation is performed bit by bit. However, in a system that requires a high throughput, it is required to calculate the CRC of input data once per data input cycle in a situation where variable-length data of a plurality of bits with a maximum size equal to a bus width can be input for each cycle.

In order to calculate the CRC of the input data once per data input cycle, in addition to a circuit for calculating the CRC of data having a size of a multiple of 4 bytes, a circuit for calculating the CRC of data obtained by subtracting 3 bytes from a multiple of 4 bytes is needed. Therefore, for example, when the bus width is 16 bytes, usually, circuits for calculating the CRC of 1-byte data, 5-byte data, 9-byte data, and 13-byte data, in addition to 4-byte data, 8-byte data, 12-byte data, and 16-byte data, are provided. Therefore, the area of the circuit for calculating the CRC increases.

DETAILED DESCRIPTION

Embodiments provide a memory system capable of reducing the area of the circuit for calculating the CRC, a packet protection circuit, and a CRC calculation method.

In general, according to one embodiment, a memory system includes a storage device and a controller. The controller controls writing of data to the storage device and reading of data from the storage device based on a request from a host device. The controller includes a host interface unit that includes a packet protection circuit. The packet protection circuit includes a plurality of first CRC calculation circuits, each configured to calculate a CRC of M-byte data, where M is an integer greater than or equal to 1 and less than N, where N is an integer greater than or equal to 2, a first selector configured to output a CRC calculation result of one of the first CRC calculation circuits, and a second CRC calculation circuit configured to calculate a CRC of L-byte data, where L<N, where L=N×Z, and Z is an integer greater than 1, and add the CRC of L-byte data to the CRC calculation result output from the first selector to generate a first CRC that is compared with a second CRC to detect an error in a data packet transmitted between the host interface unit and the host device.

Hereinafter, embodiments will be described with reference to the drawings.

First Embodiment

First, a first embodiment will be described.

Figure 1:
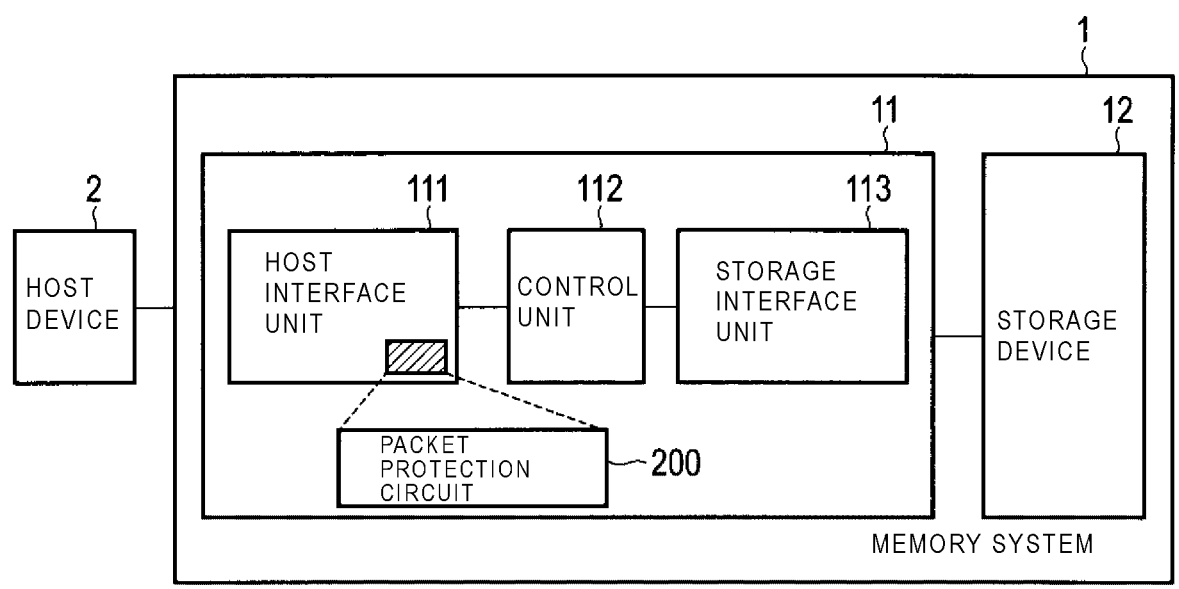
FIG. 1 is a diagram showing a configuration example of a memory system according to a first embodiment.

FIG. 1 is a diagram showing a configuration example of a memory system 1 according to the present embodiment.

The memory system 1 is connected to a host device 2 via, for example, an interface conforming to a Gen-Z standard. The memory system 1 receives a command from the host device 2, executes processing corresponding to the command, and transmits a processing result thereof to the host device 2. The command received by the memory system 1 from the host device 2 includes at least a write command to write data and a read command to read data.

Herein, it is assumed that the interface that connects the memory system 1 to the host device 2 conforms to the Gen-Z standard. Therefore, transmission of write data from the host device 2 to the memory system 1 and transmission of read data from the memory system 1 to the host device 2 are performed using packets configured in a format conforming to the Gen-Z standard. The format of the Gen-Z standard packet will be described later.

Herein, the memory system 1 is given as an example of an electronic device including the interface conforming to the Gen-Z standard, but the memory system 1 is merely an example, and a configuration for calculating a CRC to be described later may be applied to various electronic devices without being limited to the memory system 1.

The memory system 1 includes a controller 11 configured as, for example, a system on a chip (SoC), and a storage device 12 that is, for example, a NAND flash memory. In the memory system 1, writing of data into the storage device 12 and reading of data from the storage device 12 are performed under the control of the controller 11.

The controller 11 includes a host interface unit 111, a control unit 112, and a storage interface unit 113. For example, the controller 11 configured as the SoC can implement these units by loading a program called firmware, or the like from the storage device 12 and executing the program when the memory system 1 is started or reset. It is assumed that the controller 11 is configured to calculate the CRC to be described later. However, the controller 11 is merely an example of an electronic component for calculating the CRC. Various electronic components other than the controller 11 may be configured to calculate the CRC.

The host interface unit 111 controls communication with the host device 2, that is, transmission and reception of the Gen-Z standard packet. The host interface unit 111 includes a packet protection circuit 200 that provides a function of detecting errors that may occur during data transfer of the data exchanged with the host device 2. The packet protection circuit 200 will be described later. A module corresponding to the packet protection circuit 200 is also provided on the host device 2 side.

The control unit 112 receives the command from the host device 2 via the host interface unit 111, performs, for example, writing of data to the storage device 12 and reading of data from the storage device 12 corresponding to the command, via the storage interface unit 113, and transmits the processing result to the host device 2 via the host interface unit 111. In addition, when receiving a write request from the host device 2 via the host interface unit 111, the control unit 112 stores user data specified by the write request in a data buffer (not shown), and determines a storage area of the user data in the storage device 12. That is, the control unit 112 determines and manages a write destination of the user data. A correspondence relationship between a logical address of the user data received from the host device 2 and a physical address where the user data is stored is stored in a data structure called look up table (LUT). That is, the control unit 112 manages the LUT. The data specified by the write request from the host device 2 and written to the storage device 12 is called the user data.

In addition, when receiving a read request from the host device 2 via the host interface unit 111, the control unit 112 converts the logical address specified by the read request into the physical address using the above-described LUT, and instructs the storage interface unit 113 to read from the physical address.

The controller 11 includes an encoding circuit and a decoding circuit (not shown). The encoding circuit and the decoding circuit are collectively referred to as an error correcting code (ECC) circuit. The encoding circuit encodes (performs error correction encoding on) data such as the user data stored in the data buffer and management data such as the LUT, and generates a code word including a data portion and a redundant portion (referred to as parity). In the encoding performed by the encoding circuit, a Bose-Chaudhuri-Hocquenghem (BCH) code, a Reed-Solomon (RS) code, a low density parity check (LDPC) code, and the like may be used. The decoding circuit obtains the code word, which is data read from the storage device 12 via the storage interface unit 113, and decodes the obtained code word. When error correction fails during decoding, the decoding circuit notifies the control unit 112 of the error correction failure. When the decoding circuit succeeds in error correction, the control unit 112 obtains the decoded data from the decoding circuit, and transmits the obtained data to the host device 2 via the host interface unit 111.

The data buffer is used to temporarily store the user data received from the host device 2 or the management data such as the LUT until the controller 11 stores the user data and the management data in the storage device 12. In addition, the data buffer is used to temporarily store the data read from the storage device 12. The data buffer is composed of a general-purpose memory such as a static random access memory (SRAM) and a dynamic random access memory (DRAM). The data buffer may be mounted in the controller 11 or may be mounted outside the controller 11 independently of the controller 11.

The storage interface unit 113 writes the code word output from the encoding circuit into the storage device 12 under the control of the control unit 112. In addition, the storage interface unit 113 reads the data from the storage device 12 under the control of the control unit 112, and transfers the data to the decoding circuit via the buffer. Further, the storage interface unit 113 erases the data stored in the storage device 12 under the control of the control unit 112.

In addition, for example, when the storage device 12 is the NAND flash memory or includes the NAND flash memory, the control unit 112 also performs processing for eliminating a bias in use count between memory chips, which is called wear leveling, or processing for reusing an area where unnecessary data is stored, which is called garbage collection (compaction).

Figure 2:
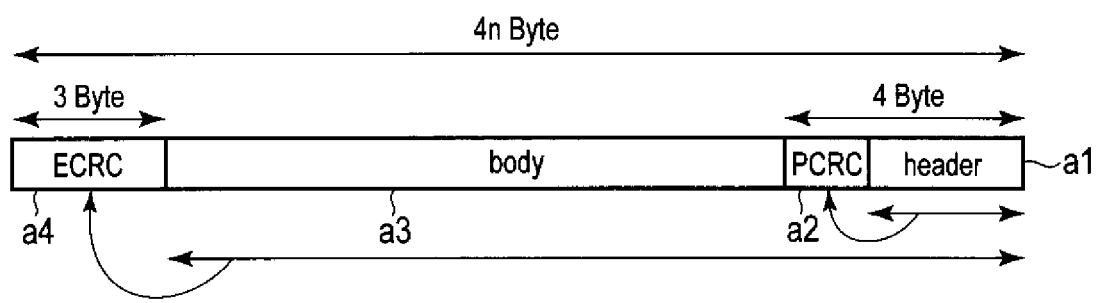
FIG. 2 is a diagram showing a format of a Gen-Z standard packet used in the memory system according to the first embodiment.

Herein, with reference to FIG. 2, the format of the Gen-Z standard packet used by the memory system 1 including the above-described configuration in communication with the host device 2 will be described.

The Gen-Z standard defines two types of CRCs, a PCRC and an ECRC, as a data protection mechanism of the packet. The PCRC is a CRC for protecting a part of a packet header, and the ECRC is a CRC for protecting the entire packet. FIG. 2 shows the format of the Gen-Z standard packet, and a right side depicts a packet head and a left side depicts a packet end. In other words, the right side is the least significant bit (LSB) side, and the left side is the most significant bit (MSB) side.

The Gen-Z standard packet is a variable-length packet whose size is specified as a multiple of 4 bytes, and in the head 4 bytes of the packet, a header (a1) and a PCRC (a2) for protecting a part of the header are arranged. In addition, in the end 3 bytes of the packet, an ECRC (a4) for protecting the entire packet (the header [a1]+the PCRC [a2]+a body [a3]) is arranged. The body a3 is, for example, the read request, or the user data specified by the write request.

For example, when the Gen-Z standard packet is transmitted from the host device 2 to the memory system 1, on the host device 2 side, the module corresponding to the packet protection circuit 200 calculates the CRC for a part of the header and stores the result thereof in the PCRC portion, and calculates the CRC for a portion excluding the ECRC portion from the head of the packet and stores the result thereof in the ECRC portion. On the other hand, on the memory system 1 side, the packet protection circuit 200 calculates the CRC for a part of the header, compares the result thereof with the PCRC to detect the errors that may occur during data transfer for a part of the header, and calculates the CRC for the portion excluding the ECRC portion from the head of the packet, compares the result thereof with the ECRC to detect the errors that may occur during data transfer for the entire packet. Therefore, it is necessary for a circuit for calculating the ECRC in the packet protection circuit 200 (also referred to as an ECRC circuit) to calculate the CRC of the data obtained by subtracting 3 bytes from a multiple of 4 bytes up to a bus width in addition to the CRC of data of a multiple of 4 bytes up to the bus width.

When the Gen-Z standard packet is transmitted from the memory system 1 to the host device 2, the ECRC is stored on the memory system 1 side, and error detection using the ECRC is performed on the host device 2 side.

Figure 3:
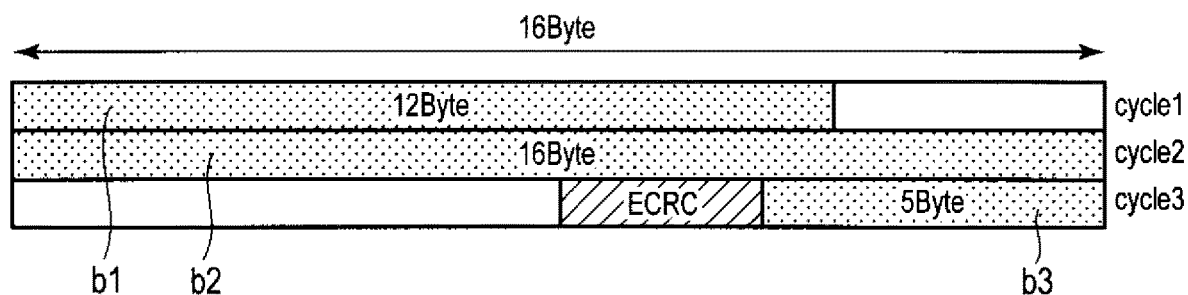
FIG. 3 is a diagram showing a transmission example of a Gen-Z standard packet.

CRC calculation is performed bit by bit. However, in a system that requires high throughput, for example, it is required to calculate the CRC once per data input cycle. FIG. 3 shows an example of a packet transmitted from the host device 2 and received by the memory system 1 over a plurality of cycles.

FIG. 3 assumes a case where the bus width is 16 bytes, and a packet having a size of 36 bytes is transmitted and received over three cycles. In FIG. 3, a blank portion on a right side of a first row (first cycle) is, for example, a part of a previous packet, and a blank portion on the left side of a third row (third cycle) is, for example, a part of a next packet. Herein, the description of the calculation of PCRC is omitted based on the assumption that it is performed separately. That is, 4 bytes of the header+PCRC disposed at the head of the packet are handled herein as 4-byte data located at the head of the data excluding the ECRC portion at the end of the packet and obtained by subtracting 3 bytes from the packet size. The PCRC is calculated by a PCRC circuit for calculating the PCRC in the packet protection circuit 200.

In the example of FIG. 3, since data b1 of 12 bytes is transmitted from the head of the packet in the initial cycle (first cycle), the ECRC circuit calculates the CRC of the 12-byte data b1. In the next cycle (second cycle), since subsequent data b2 of 16 bytes is transmitted, the ECRC circuit calculates the CRC of the 16-byte data b2, and adds it to the CRC calculated in the first cycle. In the final cycle (third cycle), since subsequent data b3 of 5 bytes (obtained by subtracting 3 bytes [ECRC portion] from 8 bytes) is transmitted, the ECRC circuit calculates the CRC of the 5-byte data b3, and adds it to the CRC calculated in the second cycle. The circuits for calculating the CRCs of the data corresponding to respective sizes, such as 12 bytes, 16 bytes, and 5 bytes are collectively referred to as CRC circuits hereinafter.

FIG. 3 shows an example in which the data b1 of 12 bytes is transmitted in the initial cycle (first cycle), the data b2 of 16 bytes is transmitted in the middle cycle (second cycle), and the data b3 of 5 bytes is transmitted in the last cycle (third cycle). However, when the bus is 16 bytes wide, there is a possibility that data of 4 bytes or 8 bytes also may be transmitted in the first cycle, and that data of 1 byte, 9 bytes, and 13 bytes also may be transmitted in the final cycle. When data transfer is completed in one cycle, such a cycle is referred to as both the initial cycle and the final cycle.

Figure 4:
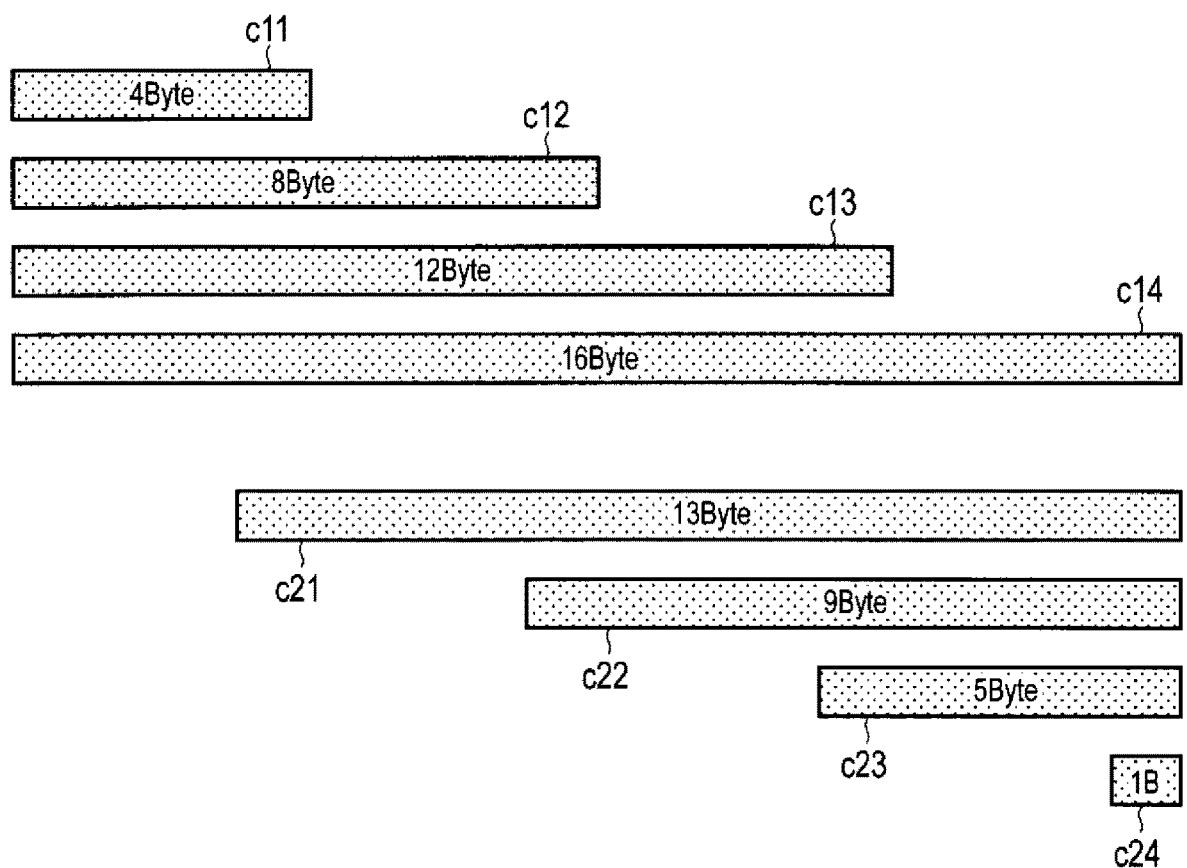
FIG. 4 is a diagram showing types of CRC circuits that are originally required in an ECRC circuit when a Gen-Z standard packet is transmitted as shown in FIG. 4.

Therefore, the ECRC circuit may be implemented with CRC circuits corresponding to the respective sizes of 4 bytes, 8 bytes, 12 bytes, 16 bytes (c11 to c14) that are multiples of 4 bytes, and 1 byte, 5 bytes, 9 bytes, 13 bytes (c21 to c24) obtained by subtracting 3 bytes from a multiple of 4 bytes as shown in FIG. 4.

Figure 5:
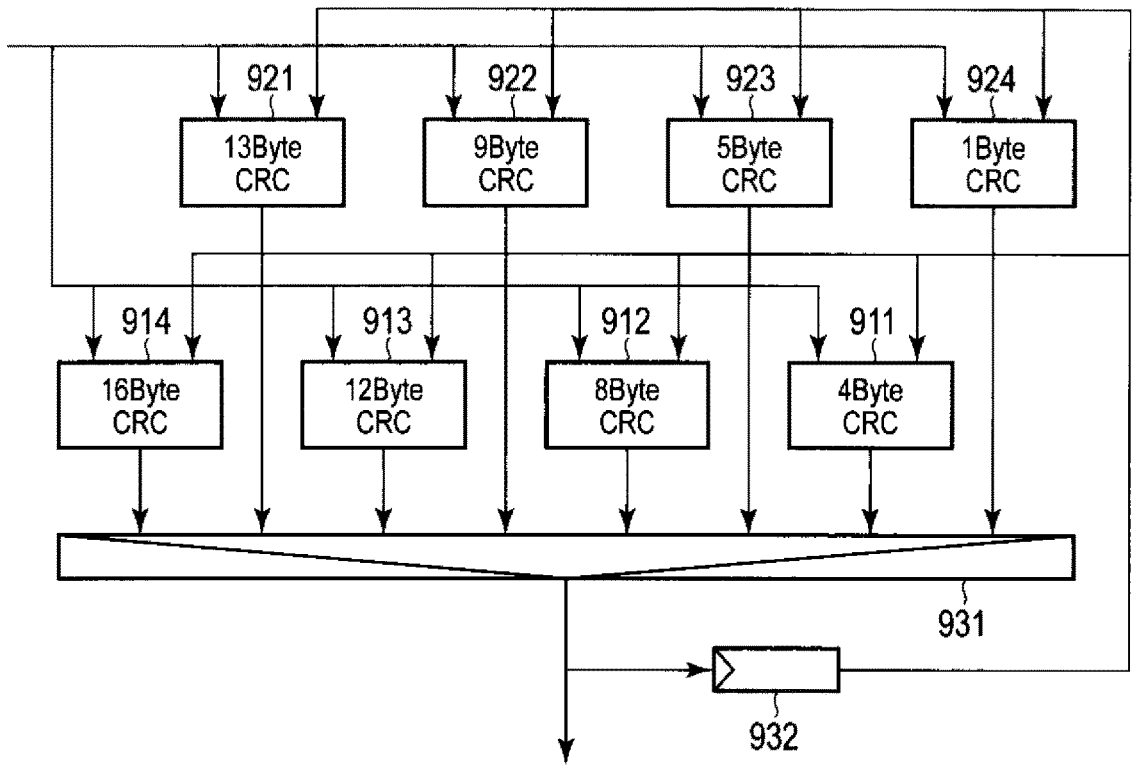
FIG. 5 is a diagram showing a configuration example (comparative example) of the ECRC circuit when the Gen-Z standard packet is transmitted as shown in FIG. 4.

Herein, as a comparative example, FIG. 5 shows a configuration example of an ECRC circuit in which CRC circuits corresponding to respective sizes shown in FIG. 4 are implemented.

In FIG. 5, CRC circuits 911 to 914 are provided corresponding to the respective sizes of a multiple of 4 bytes, and CRC circuits 921 to 924 are provided corresponding to the respective sizes obtained by subtracting 3 bytes from a multiple of 4 bytes. A selector 931 selects and outputs any one of the CRCs calculated by the CRC circuits 911 to 914 and the CRCs calculated by the CRC circuits 921 to 924. A memory circuit 932 such as a flip-flop circuit stores the CRC or an initial value (seed value) output from the selector 931.

For example, when a 36-byte packet (33-byte [36−3] data) is transmitted in 3 cycles and when 12-byte data including header+PCRC is transferred in the initial cycle (first cycle) as shown in FIG. 3, in the ECRC circuit, the selector 931 is controlled to select and output the CRC calculated by the CRC circuit 913 that calculates the CRC of 12-byte data.

The data corresponding to the respective sizes from the head of the data transferred in each cycle is input to the CRC circuits 911 to 914 and 921 to 924. The data of the initial cycle is input after being shifted to the LSB side and right-justified. When a data size is 12 bytes, unfixed data is input to the CRC circuit 921 or the CRC circuit 914. The CRC circuit 921 calculates the CRC of 13-byte data. The CRC circuit 914 that calculates the CRC of the 16-byte data. Alternatively, only one of the CRC circuits 911 to 914 and 921 to 924 may be adaptively operated according to the data size.

For example, when packet reception starts, the memory circuit 932 is controlled to store the initial value. The CRC circuits 911 to 914 and 921 to 924 calculate the CRC of the input data and add it with the CRC stored in the memory circuit 932.

As described above, in the first cycle in which 12-byte data is transmitted, since the selector 931 is controlled to select and output the CRC calculated by the CRC circuit 913 that calculates the CRC of the 12-byte data, the CRC stored in the memory circuit 932 is updated from the initial value to the CRC of the 12-byte data from the head. This CRC is an intermediate result of the CRC of 33-byte data to be calculated. In the first cycle, the CRC circuits 911, 912, 914, and 921 to 924 other than the CRC circuit 913 also perform CRC calculation. When the selector 931 selects the CRC circuit 913, the CRCs calculated by the CRC circuits 911, 912, 914, and 921 to 924 are discarded.

In the second cycle in which the 16-byte data is transmitted, the selector 931 is controlled to select and output the CRC calculated by the CRC circuit 914 that calculates the CRC of the 16-byte data. In addition, the CRC circuits 911 to 914 and 921 to 924 including the CRC circuit 914 calculate the CRC of the input data and add it to the CRC stored in the memory circuit 932. When the selector 931 selects the CRC circuit 914, the CRCs calculated by CRC circuits other than the CRC circuit 914 are discarded. As a result, the CRC stored in the memory circuit 932 is updated from the CRC of the 12-byte data from the head to the CRC of 28-byte (12+16) data from the head. This CRC is also the intermediate result.

In the final cycle (third cycle) in which 5-byte data is transmitted along with 3-byte ECRC, the selector 931 is controlled to select and output the CRC calculated by the CRC circuit 923 that calculates the CRC of the 5-byte data. In addition, the CRC circuits 911 to 914 and 921 to 924 including the CRC circuit 923 calculate the CRC of the input data and add it to the CRC stored in the memory circuit 932. Similar to the initial cycle, data followed by indefinite data after the 6th byte is input to the CRC circuits (912, 913, 914, 921, and 922) that calculate the CRC of data having a size larger than 5 bytes. When the selector 931 selects the CRC circuit 923, the CRCs calculated by CRC circuits other than the CRC circuit 923 are discarded. Accordingly, the CRC of 33-byte (28+5) data from the head, which is a final result, is output from the selector 931. The packet protection circuit compares the ECRC disposed at the end of the packet with the CRC which is the final result output from the selector 931 to detect the error that may occur during data transfer.

Figure 6:
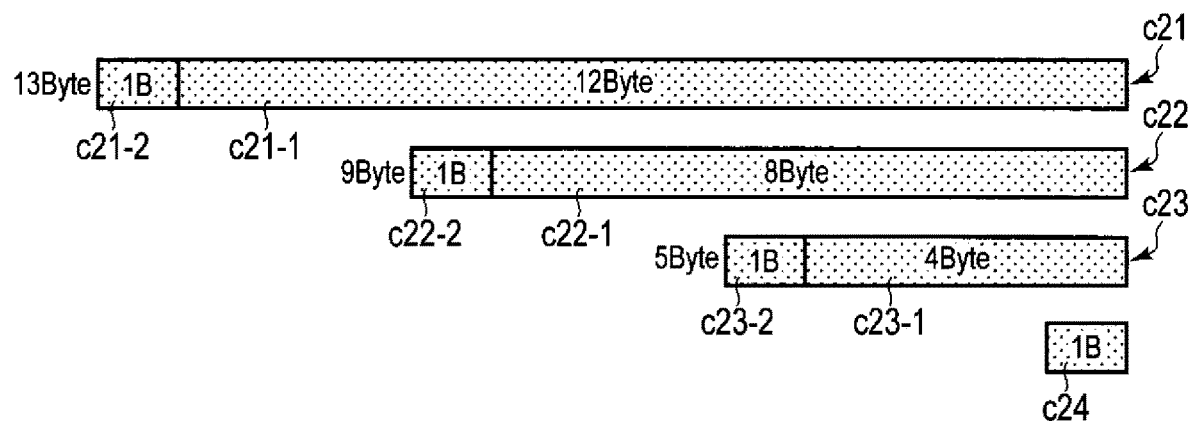
FIG. 6 is a diagram showing a method for handling data each piece obtained by subtracting 3 bytes from a multiple of 4 bytes in the memory system according to the first embodiment.

Next, the ECRC circuit of the memory system 1 according to the present embodiment will be described with reference to FIGS. 6 and 7. Herein, it is also assumed that the bus width is 16 bytes. That is, the interface that connects the memory system 1 to the host device 2 can transmit and receive the 16-byte data at a time.

When the bus width is 16 bytes, there may be data of four sizes of 1 byte, 5 bytes, 9 bytes, and 13 bytes, which is transferred in the final cycle, as the data obtained by subtracting 3 bytes from a multiple of 4 bytes. In the above-described comparative example, four CRC circuits (921 to 924) are implemented corresponding to respective four sizes. In contrast, in the memory system 1 according to the present embodiment, each piece of data (FIG. 4: c21 to c24) obtained by subtracting 3 bytes from a multiple of 4 bytes is divided into a portion of a multiple of 4 bytes and a portion of remaining 1 byte as shown in FIG. 6, and for three sizes of 5 bytes, 9 bytes, and 13 bytes, the CRC circuits of data with those sizes are not required. For 1-byte data (c24), the portion of a multiple of 4 bytes is considered to be 4×0=0 byte, and the entire data is handled as the portion of the remaining 1 byte.

That is, in the memory system 1 according to the present embodiment, 5-byte data (c23) is divided into 4-byte data (c23-1) and 1-byte data (c23-2). 9-byte data (c22) is divided into 8-byte data (c22-1) and the 1-byte data (c22-2). 13-byte data (c21) is divided into 12-byte data (c21-1) and the 1-byte data (c23-2). For the 4-byte data (c23-1) divided from the 5-byte data (c23), the 8-byte data (c22-1) divided from the 9-byte data (c22), and the 12-byte data (c21-1) divided from 13-byte data (c21), the CRC circuits provided corresponding to the respective sizes of multiples of 4 bytes are used to calculate the CRCs.

Figure 7:
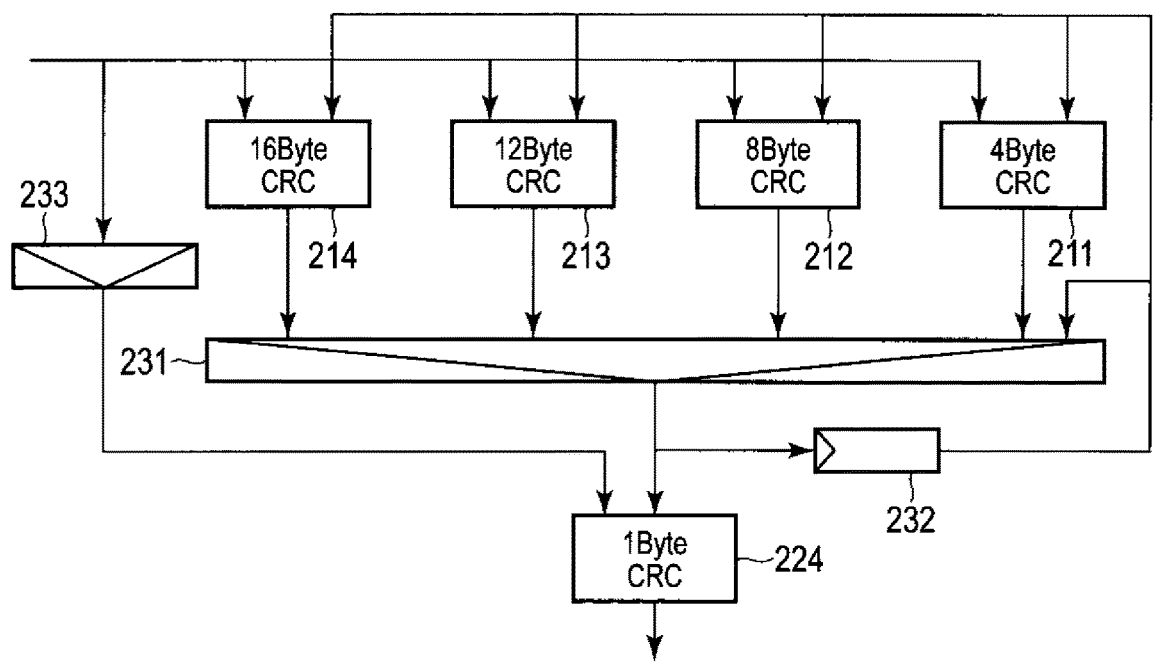
FIG. 7 is a diagram showing a configuration example of an ECRC circuit in a packet protection circuit in the memory system according to the first embodiment.

FIG. 7 shows a configuration example of an ECRC circuit in the packet protection circuit 200 in the memory system 1 according to the present embodiment.

As shown in FIG. 7, the ECRC circuit according to the present embodiment includes CRC circuits 211 to 214 provided corresponding to the respective sizes of multiples of 4 bytes, a selector 231 that selects and outputs any one of CRCs calculated by the CRC circuits 211 to 214, a memory circuit 232 that stores the CRC or the initial value (seed value) output from selector 231, a selector 233 that selects a position of the last 1 byte and outputs the 1-byte data, and a CRC circuit 224 that calculates the CRC of the 1-byte data. The selector 233 adaptively outputs the last 1-byte data whose position differs depending on the data size as shown in FIG. 6 according to the data size. The CRC circuit 224 is for calculating the CRCs of data of 1 byte (c21-2, c22-2, c23-2, c24) from the data each piece obtained by subtracting 3 bytes from a multiple of 4 bytes and transmitted in the final cycle as shown in FIG. 6, that is, the CRCs of the last 1-byte data obtained by subtracting 3 bytes from the packet size. The selector 231 may also select and output the CRC (intermediate result or initial value) stored in the memory circuit 232 in addition to the CRCs calculated by the CRC circuits 211 to 214.

In the ECRC circuit according to the present embodiment, the data corresponding to the respective sizes from the head of the data is input to the CRC circuits 211 to 214. The data of the initial cycle is input after being shifted to the LSB side and right-justified. Further, adjustment of the data length, such as padding with unfixed data is performed as necessary. Alternatively, only one of the CRC circuits 211 to 214 may be adaptively operated according to the data size.

The CRC circuits 211 to 214 calculate the CRC of the input data and add it with the value stored in the memory circuit 232. In addition, the CRC circuit 224 calculates the CRC of the input 1-byte data and adds it to the CRC output from the selector 231.

Here, it is assumed that the 36-byte packet (33-byte [36−3] data) is transmitted in 3 cycles and the 12-byte data including header+PCRC is transmitted in the initial cycle (first cycle) as shown in FIG. 3.

In this case, in the initial cycle (first cycle), the selector 231 is controlled to select and output the CRC calculated by the CRC circuit 213 that calculates the CRC of the 12-byte data. The memory circuit 232 is controlled to store the initial value when the ECRC calculation starts. As a result, the CRC of the 12-byte data from the head is calculated and is stored in the memory circuit 232 as the intermediate result. That is, the value stored in the memory circuit 232 is updated from the initial value to the CRC of the 12-byte data from the head. In the first cycle, the CRC circuit 224 is not used. The CRC circuit 224 is used only in the final cycle.

In the second cycle, the selector 231 is controlled to select and output the CRC calculated by the CRC circuit 214 that calculates the CRC of the 16-byte data. The CRC circuit 214 calculates the CRC of the input data and adds it to the value stored in the memory circuit 232. Accordingly, the CRC of the 28-byte (12+16) data from the head is calculated and is stored in the memory circuit 232 as the intermediate result. That is, the value stored in the memory circuit 232 is updated from the CRC of the 12-byte data from the head to the CRC of 28-byte data from the head. In the second cycle, which is not the final cycle, the CRC circuit 224 is not used.

In the final cycle (third cycle), since the 5-byte data is transmitted, first, the 5-byte data is divided into the 4-byte data that is the portion of a multiple of 4 bytes and the 1-byte data that is the portion of the remaining 1 byte. The CRC of the data that is the portion of a multiple of 4 bytes is calculated by the CRC circuits 211 to 214 as the same in the first and second cycles. That is, the selector 231 is controlled to select and output the CRC calculated by the CRC circuit 211 that calculates the CRC of the 4-byte data. The CRC circuit 211 calculates the CRC of the input data and adds it to the value stored in the memory circuit 232. Accordingly, the CRC of 32-byte (28+4) data from the head is calculated.

On the other hand, the CRC of the 1-byte data that is the portion of the remaining 1 byte is calculated by the CRC circuit 224. That is, in the third cycle which is the final cycle, the CRC circuit 224 for calculating the CRC of the last 1-byte data obtained by subtracting 3 bytes from the packet size is used. The CRC circuit 224 calculates the CRC of the last 1-byte data output from the selector 233, adds it to the CRC output from the selector 231, and outputs the added result. The CRC output from the CRC circuit 224 is the final result of the CRC of 33-byte (32+1) data from the head, that is, the CRC to be calculated for the data obtained by subtracting 3 bytes from the packet size. The packet protection circuit 200 compares the ECRC disposed at the end of the packet with the CRC which is the final result of the CRC output from the CRC circuit 224 to detect the error that may occur during data transfer.

When the size of data transmitted in the final cycle is 1 byte, the entire data is handled as the data that is the portion of the remaining 1 byte and is input to the CRC circuit 224 via the selector 233, and the CRC thereof is calculated. In this case, the selector 231 is controlled to select and output the value stored in the memory circuit 232. Accordingly, the CRC of the data obtained by subtracting 3 bytes from the packet size is calculated and output by the CRC circuit 224.

In this way, there is no need to mount multiple CRC circuits for calculating the CRC of the data obtained by subtracting 3 bytes from each of a multiple of 4 bytes, other than the CRC circuit for calculating the CRC of 1 byte data in the ECRC circuit according to the present embodiment. That is, the memory system 1 according to the present embodiment can reduce the circuit area of the circuit for calculating the CRC.

Second Embodiment

Next, the second embodiment will be described.

In the present embodiment, it is also assumed that the memory system 1 is connected to the host device 2 via the interface conforming to the Gen-Z standard. Therefore, the same elements as those in the first embodiment are denoted by the same reference numerals and the description thereof is omitted.

In the first embodiment, it is assumed that the bus width is 16 bytes. Therefore, four CRC circuits 211 to 214 of 4 bytes, 8 bytes, 12 bytes, and 16 bytes, and the CRC circuit 224 of the last one byte are implemented on the ECRC circuit. In this way, when the bus width is 16 bytes, four CRC circuits 211 to 214 are provided as the CRC circuits for calculating the CRC of the data having a size of a multiple of 4 bytes. When the bus width increases and the bus width is 32 bytes, eight CRC circuits adding 20 bytes, 24 bytes, 28 bytes, and 32 bytes are required. In addition, when the bus width is 64 bytes, sixteen CRC circuits adding 36 bytes, 40 bytes, 44 bytes, 48 bytes, 52 bytes, 56 bytes, 60 bytes, and 64 bytes are further required. That is, it is necessary to increase the number of CRC circuits when the bus width increases.

Figure 8:
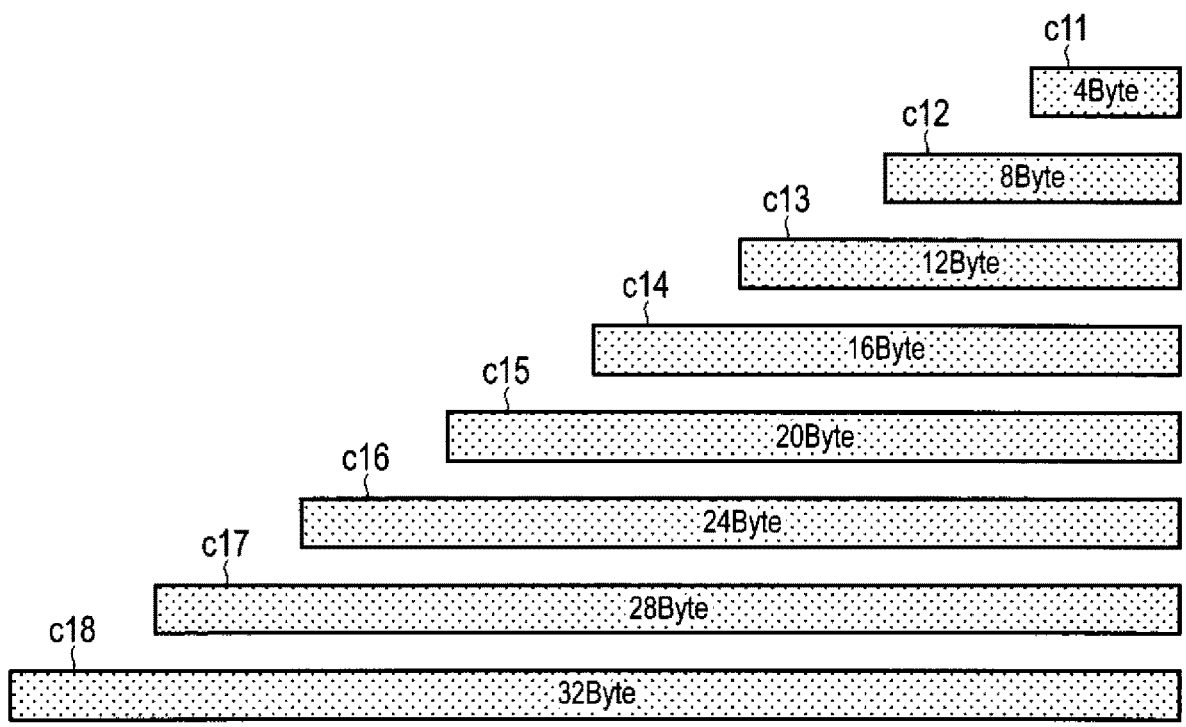
FIG. 8 is a diagram showing data each piece having a size of a multiple of 4 bytes that can be generated in a memory system according to a second embodiment.

In the present embodiment, it is assumed that the bus width is 32 bytes. That is, it is assumed that the bus width is increased from 16 bytes in the first embodiment to 32 bytes. In this case, as the data having a size of a multiple of 4 bytes, since there are 4 bytes, 8 bytes, 12 bytes, 16 bytes, 20 bytes, 24 bytes, 28 bytes, and 32 bytes (c11 to c18) as shown in FIG. 8, CRC circuits corresponding to the respective sizes are required. Therefore, as described above, compared with the case where the bus width is 16 bytes, four CRC circuits of 20 bytes, 24 bytes, 28 bytes and 32 bytes are further required.

Figure 9:
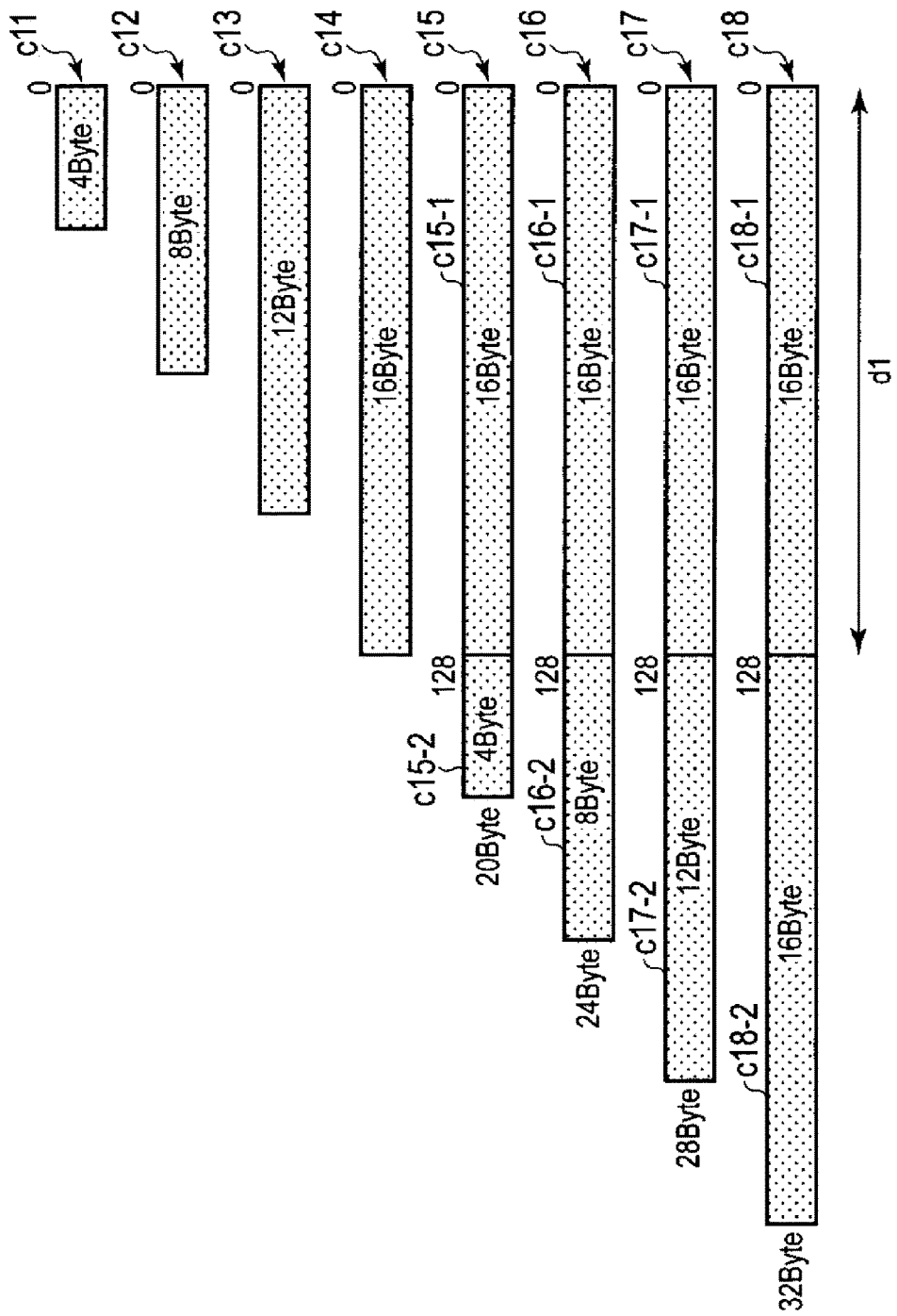
FIG. 9 is a diagram showing a method for handling data each piece having a size of a multiple of 4 bytes in the memory system according to the second embodiment.

As shown in FIG. 9, the memory system 1 according to the present embodiment divides the 20-byte, 24-byte, 28-byte, 32-byte (c15 to c18) data into 16 bytes (c15-1, c16-1, c17-1, c18-1) on the LSB side and 4 bytes, 8 bytes, 12 bytes, and 16 bytes (c15-2, c16-2, c17-2, c18-2) on the MSB side. Therefore, the memory system 1 according to the present embodiment implements the calculation of the CRCs of the 20-byte, 24-byte, 28-byte, 32-byte (c15 to c18) data by adding only one CRC circuit that calculates the CRC of the 16-byte data (FIG. 9: d1 portion).

Figure 10:
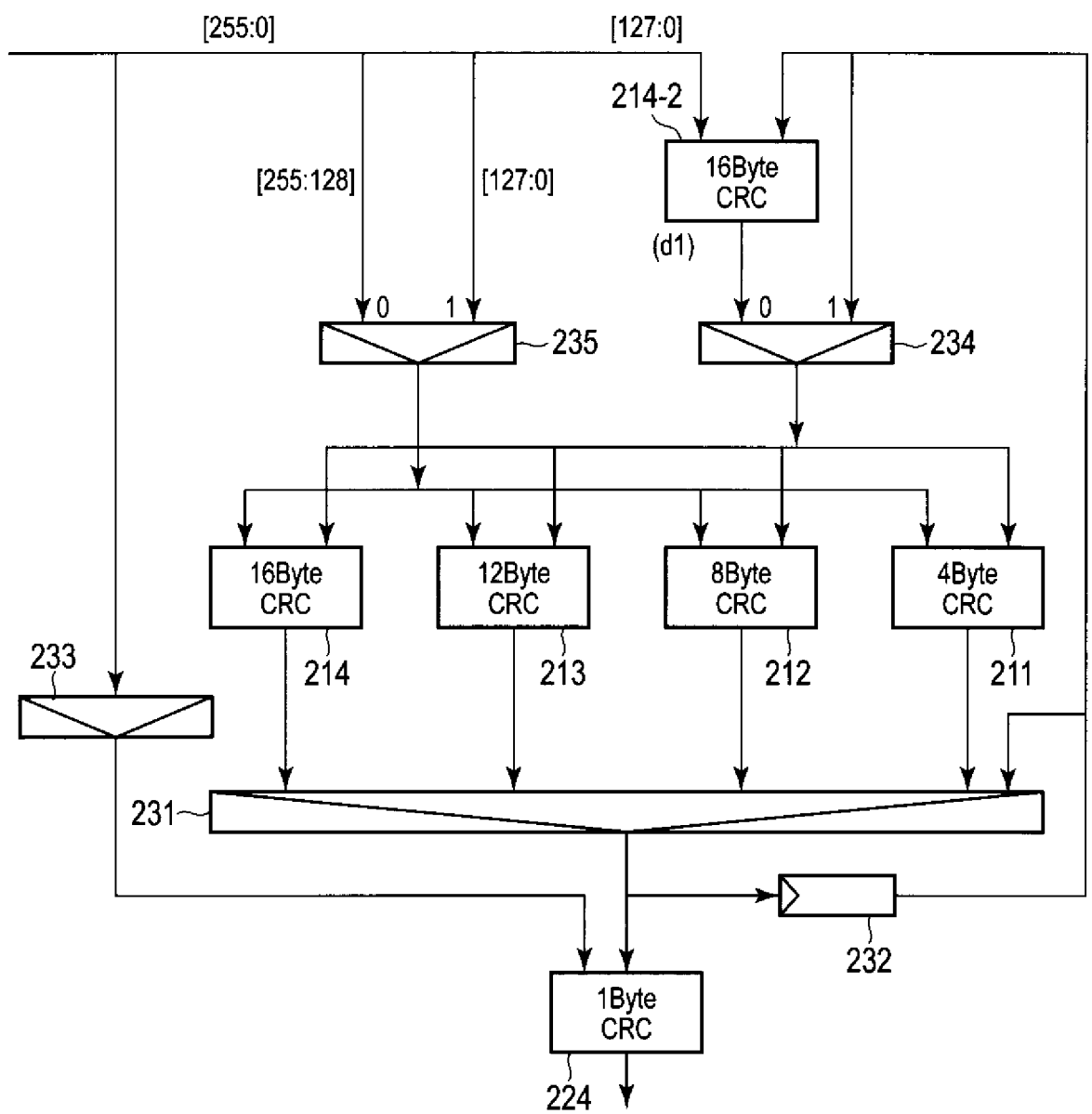
FIG. 10 is a diagram showing a configuration example of an ECRC circuit in a packet protection circuit in the memory system according to the second embodiment.

FIG. 10 shows a configuration example of an ECRC circuit in the packet protection circuit 200 in the memory system 1 according to the present embodiment.

As shown in FIG. 10, similar to the first embodiment, the ECRC circuit according to the present embodiment includes the CRC circuits 211 to 214, the selector 231, the memory circuit 232, the selector 233, and the CRC circuit 224. In addition, the ECRC circuit according to the present embodiment includes a CRC circuit 214-2 for calculating the CRC of the 16-byte data on the LSB side when the data size is greater than or equal to 20 bytes, a selector 234 for selecting whether to use the output of the CRC circuit 214-2, and a selector 235 for selecting whether to input data corresponding to the respective sizes from the head (bit 0) of the data or to input data corresponding to the respective sizes from the 17th byte (bit 128: second half) of the data to the CRC circuits 211 to 214. The selector 234 outputs the CRC stored in the memory circuit 232 when the output of the CRC circuit 214-2 is not used. That is, the selector 234 selects and outputs one of the CRC calculated by the CRC circuit 214-2 and the CRC stored in the memory circuit 232.

Even in the ECRC circuit according to the present embodiment, the overall flow in which CRC calculated in each cycle other than the final cycle is added using the memory circuit 232, and CRC of data each piece obtained by subtracting 3 bytes from the packet size is calculated by calculating the CRC of the data of a multiple of 4 bytes and the CRC of the last 1-byte data in the final cycle, is the same as in the first embodiment. Herein, a difference from the first embodiment in the case of calculating the CRC of the data of a multiple of 4 bytes will be described. Specifically, a case where a CRC of data of greater than or equal to 20 bytes which is a size that is a multiple of 4 bytes is calculated and a case where a CRC of data of less than or equal to 16 bytes which is a size that is a multiple of 4 bytes is calculated will be described.

For example, when the CRC of 24-byte data is calculated, the selector 234 is controlled such that the output of the CRC circuit 214-2 is used, and the selector 235 is controlled such that data corresponding to the respective sizes from the 17th byte (second half) of the data is input to the CRC circuits 211 to 214. FIG. 10 shows a state where 0 sides of the selectors 234 and 235 are selected.

16-byte (first half) data from the head of the data is input to the CRC circuit 214-2. Herein, the CRC circuit 214-2 calculates the CRC of the 16-byte data from the head in the 24-byte data, and adds it to the CRC (intermediate result or initial value) stored in the memory circuit 232. Since the 0 side of the selector 234 is selected, the calculation result (CRC) of the CRC circuit 214-2 is output from the selector 234.

Meanwhile, since the 0 side of the selector 235 is selected, data corresponding to the respective sizes from the 17th byte (second half) of the data is input to the CRC circuits 211 to 214. At this time, the selector 231 is controlled to select and output the CRC calculated by the CRC circuit 212 that calculates the CRC of 8-byte (24–16) data. The CRC circuit 212 calculates the CRC of the input data, that is, the 8-byte (to the end) data from the 17th byte in the 24-byte data, and adds it to the CRC output from the selector 234.

Accordingly, an updated CRC obtained by combining the CRC of the 24-byte data calculated in the current cycle with the CRC calculated in the previous cycle is output from the selector 231.

In addition, for example, when a CRC of 12-byte data is calculated, the selector 234 is controlled such that the output of the CRC circuit 214-2 is not used, and the selector 235 is controlled such that the data corresponding to the respective sizes from the head of the data is input to the CRC circuits 211 to 214. FIG. 10 shows a state where 1 sides of the selectors 234 and 235 are selected.

When the 1 side of the selector 234 is selected, the CRC (intermediate result or initial value) stored in the memory circuit 232 is output from the selector 234. When the 1 side of the selector 235 is selected, the data corresponding to the respective sizes from the head of the data is input to the CRC circuits 211 to 214. At this time, the selector 231 is controlled to select and output the CRC calculated by the CRC circuit 213 that calculates the CRC of the 12-byte data. The CRC circuit 212 calculates the CRC of the input 12-byte data, and adds it to the CRC output from the selector 234.

Accordingly, an updated CRC obtained by combining the CRC of the 12-byte data calculated in the current cycle to the CRC calculated up to the previous cycle is output from the selector 231.

In this way, for example, when the bus width increases from 16 bytes to 32 bytes, the ECRC circuit according to the present embodiment implements the calculation of the CRCs of the 20-byte, 24-byte, 28-byte, 32-byte data by adding only one CRC circuit that calculates the CRC of the 16-byte data. That is, the memory system 1 according to the present embodiment can reduce the circuit area of the circuit for calculating the CRC.

Figure 11:
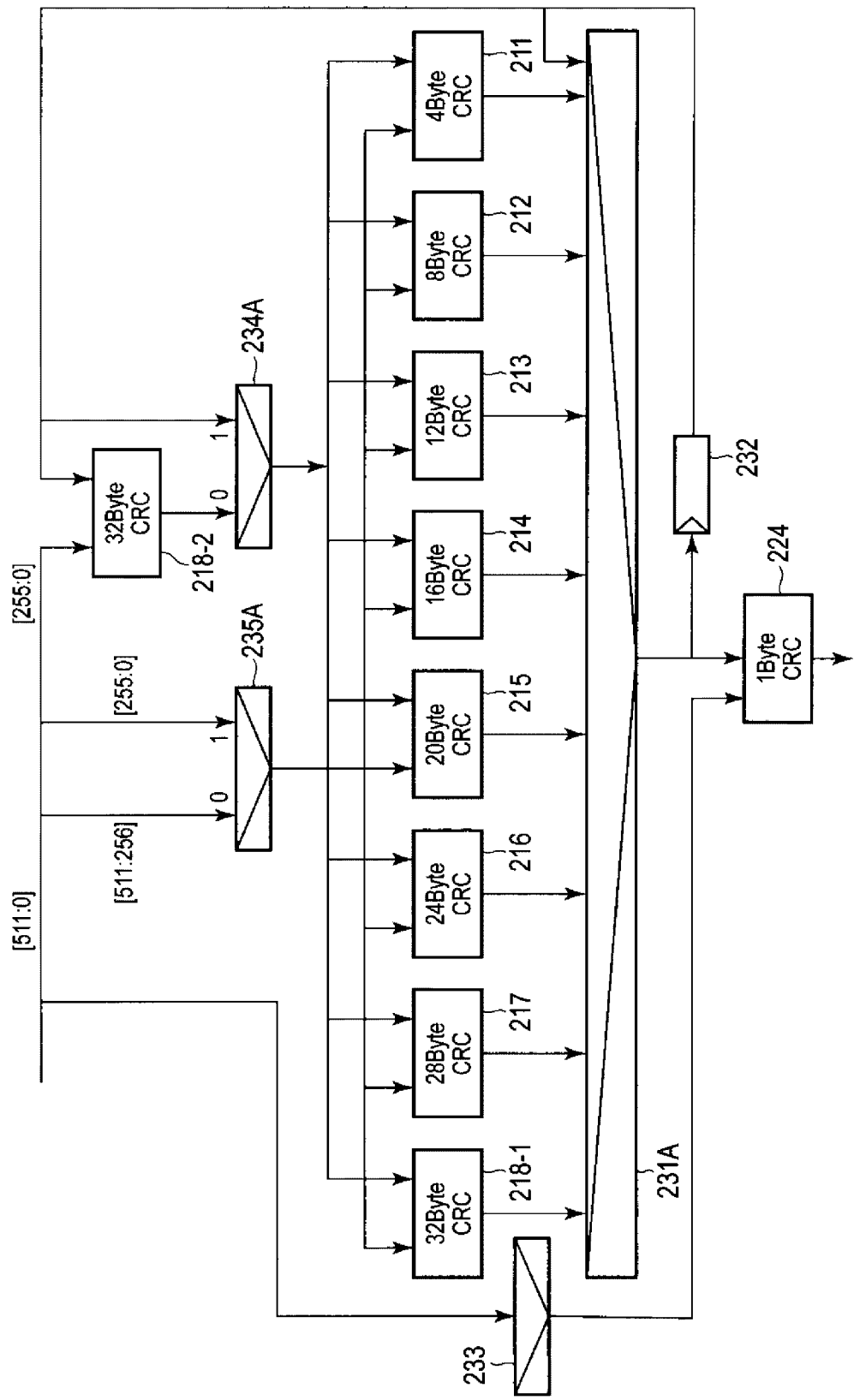
FIG. 11 is a diagram showing a configuration example of an ECRC circuit in a packet protection circuit in a first modification (change of a bus width) of the memory system according to the second embodiment.

FIG. 11 is a diagram showing a configuration example of the ECRC circuit configured to calculate CRCs of data from 36 bytes to 64 bytes when the bus width is 64 bytes by using two CRC circuits 218-1 and 218-2 that calculates the CRC of 32-byte data in combination with CRC circuits 211 to 217 that calculate the CRCs of data from 4 bytes to 28 bytes. Even in this case, two selectors (234A and 235A) may be controlled according to the size of the transferred data, more specifically, according to whether the size of the transferred data exceeds half of the bus width.

Figure 12:
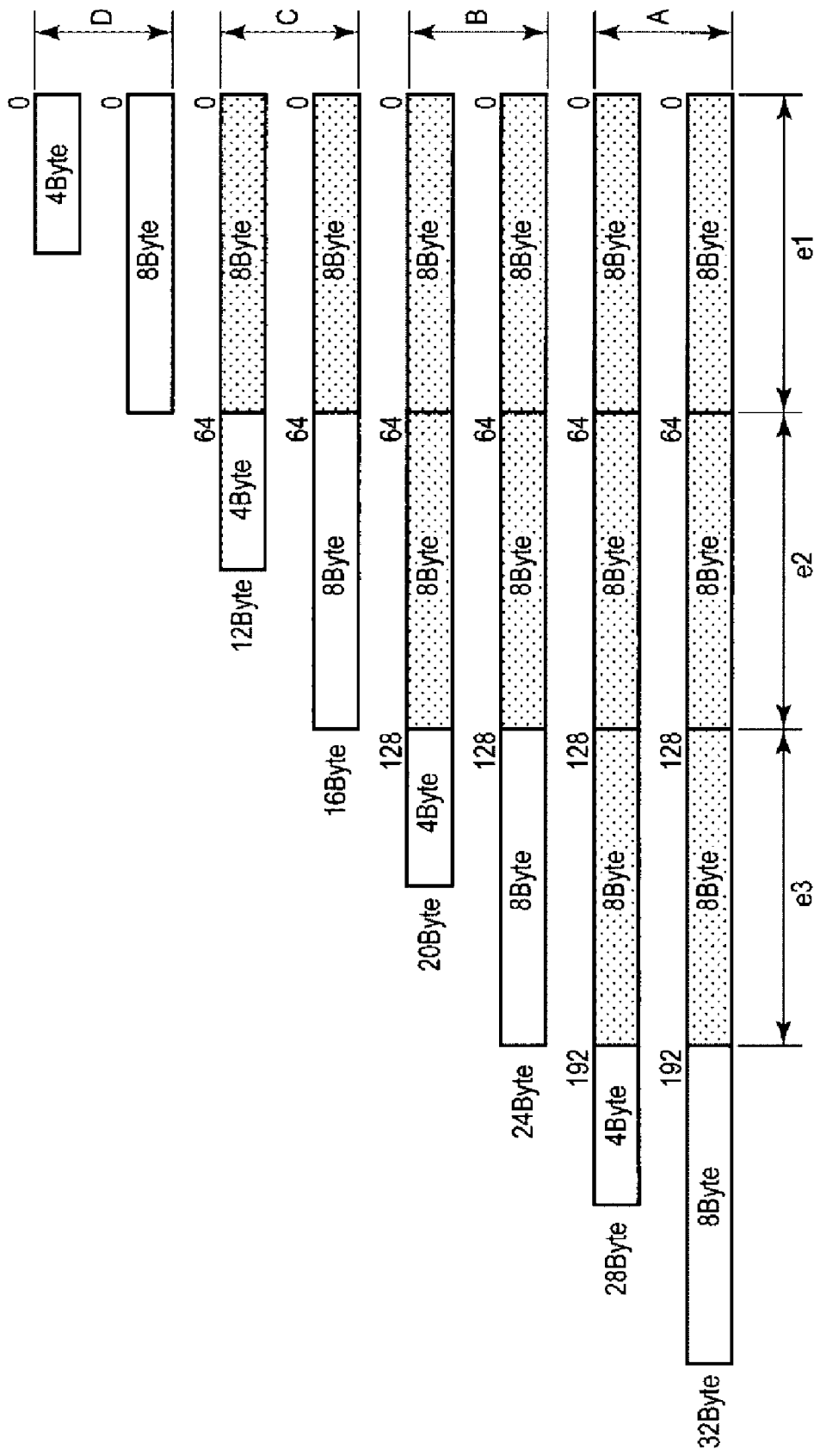
FIG. 12 is a diagram for showing a method for handling data each piece having a size of a multiple of 4 bytes in a second modification (change of a number of divisions of data) of the memory system according to the second embodiment.

In the above description, an example of calculating the CRC by dividing data having a size exceeding half the bus width into two parts, a first half and a second half, is described. The number of divisions of data is not limited to two, and for example, may be four ($2^n$). FIG. 12 is a diagram showing a method for handling data from 4 bytes to 32 bytes each piece of which is a multiple of 4 bytes when the bus width is 32 bytes and the CRC is calculated by dividing the data into four parts.

As shown in FIG. 12, the CRC of data with the size exceeding 8 bytes of bus width divided by 4 is calculated by dividing into one or more 8-byte data (FIG. 12: hatched parts of each section of e1, e2, and e3) each of which is a portion of a multiple of 8 bytes, and 4-byte or 8-byte data that is a remaining portion. When the data size exceeds 8 bytes and is a multiple of 8 bytes, the last 8-byte data is handled as the remaining 8-byte data. In addition, when the data size is equal to or less than 8 bytes, that is, 4 bytes or 8 bytes, the last 4-byte or 8-byte data is also handled as the remaining 4-byte or 8-byte data. For one or more 8-byte data (FIG. 12: hatched parts of each section of e1, e2, and e3) each of which is the portion of a multiple of 8 bytes, three CRC circuits that calculate the CRC thereof are implemented hierarchically.

Figure 13:
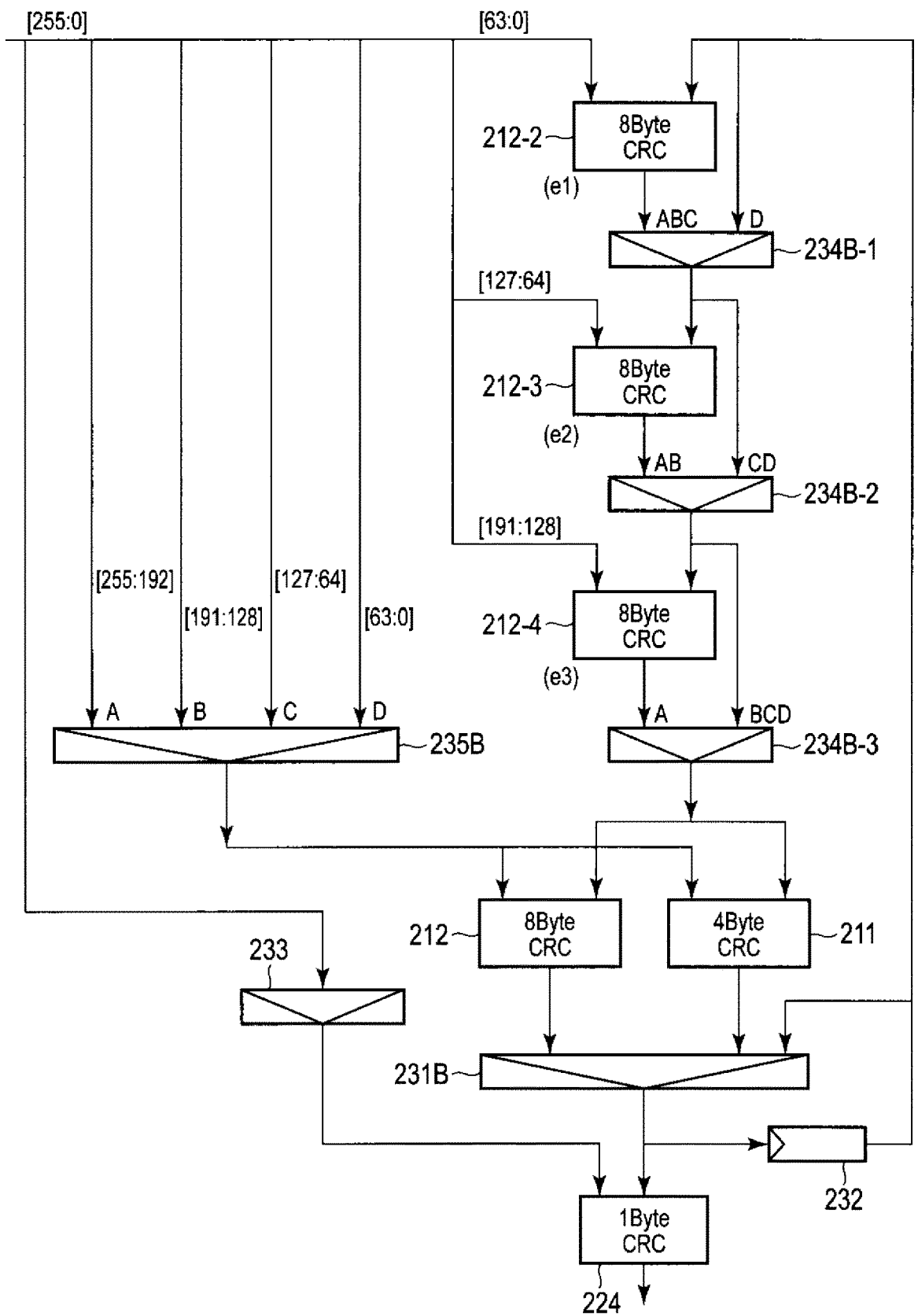
FIG. 13 is a diagram showing a configuration example of an ECRC circuit in a packet protection circuit in the second modification of the memory system according to the second embodiment.

In FIG. 12, symbols A, B, C, and D indicate selection conditions of the selectors in the ECRC circuit shown in FIG. 13. FIG. 13 is a diagram showing a configuration example of the ECRC circuit when the bus width is 32 bytes and the CRC is calculated by dividing the data into four parts.

In FIG. 13, the CRC circuit 211 is a CRC circuit that calculates the CRC of the remaining 4-byte data, and the CRC circuit 212 is a CRC circuit that calculates the CRC of the remaining 8-byte data. In addition, a CRC circuit 212-2 is a CRC circuit that calculates the CRC of 8-byte (FIG. 12: hatched part of the section of e1) data from the head (bit 0) of the data when the data exceeds 8 bytes. A CRC circuit 212-3 is a CRC circuit that calculates the CRC of 8-byte (FIG. 12: hatched part of the section of e2) data from the 9th byte (bit 64) of the data when the data exceeds bytes. A CRC circuit 212-4 is a CRC circuit that calculates the CRC of 8-byte (FIG. 12: hatched part of the section of e3) data from the 17th byte (bit 128) of the data when the data exceeds 24 bytes.

That is, a selector 231B selects and outputs one of the CRCs calculated by the CRC circuits 211 and 212. A selector 234B-1 selects whether to use the output of the CRC circuit 212-2. The selector 234B-1 outputs the CRC stored in the memory circuit 232 when the output of the CRC circuit 212-2 is not used. That is, the selector 234B-1 selects and outputs one of the CRC calculated by the CRC circuit 212-2 and the CRC stored in the memory circuit 232.

A selector 234B-2 selects whether to use the output of the CRC circuit 212-3. The selector 234B-2 outputs the output of the selector 234B-1 when the output of the CRC circuit 212-3 is not used. That is, the selector 234B-2 selects and outputs one of the CRC calculated by the CRC circuit 212-3 and the output of the selector 234B-1.

A selector 234B-3 selects whether to use the output of the CRC circuit 212-4. The selector 234B-3 outputs the output of the selector 234B-2 when the output of the CRC circuit 212-4 is not used. That is, the selector 234B-3 selects and outputs one of the CRC calculated by the CRC circuit 212-4 and the output of the selector 234B-2.

In addition, a selector 235B selects whether to input, to the CRC circuits 211 and 212, data corresponding to the respective sizes from the head (bit 0) of the data, data corresponding to the respective sizes from the 9th byte (bit 64) of the data, data corresponding to the respective sizes from the 17th byte (bit 128) of the data, data corresponding to the respective sizes from the 25th byte (bit 192) of the data.

For example, in a case of 4-byte or 8-byte data, the selectors 234B-1, 234B-2, and 234B-3 are controlled such that none of the output of the CRC circuits 212-2, 212-3, and 212-4 is used. In addition, the selector 235B is controlled such that the data corresponding to the respective sizes from the head of the data is input to the CRC circuits 211 and 212. FIG. 13 shows a state where D sides of the selector 234B-1, the selector 234B-2, the selector 234B-3, and the selector 235B are selected. The selector 231B is controlled such that the CRC circuit 211 that calculates the CRC of 4-byte data is selected when the data is 4 bytes, and that the CRC circuit 212 that calculates the CRC of 8-byte data is selected when the data is 8 bytes.

In this case, the CRC stored in the memory circuit 232 is output from the selector 234B-3 via the selectors 234B-1 and 234B-2. The CRC circuits 211 and 212 calculate the CRC of the input data and add it with the CRC output from the selector 234B-3.

In addition, in a case of 12-byte or 16-byte data, the selectors 234B-1, 234B-2, and 234B-3 are controlled such that only the output of the CRC circuit 212-2 is used. In this case, the selector 235B is controlled such that the data corresponding to the respective sizes from the 9th byte of the data is input to the CRC circuits 211 and 212. FIG. 13 shows a state where C sides of the selector 234B-1, the selector 234B-2, the selector 234B-3, and the selector 235B are selected. The selector 231B is controlled such that the CRC circuit 211 that calculates the CRC of 4-byte (12–8) data is selected when the data is 12 bytes, and that the CRC circuit 212 that calculates the CRC of 8-byte (16–8) data is selected when the data is 16 bytes.

The CRC circuit 212-2 calculates the CRC of 8-byte data from the head of the data, and adds it to the CRC stored in the memory circuit 232. In this case, the output of the CRC circuit 212-2 is output from the selector 234B-3 via the selectors 234B-1 and 234B-2, and the CRC circuits 211 and 212 calculate the CRC of the input data and add it with the CRC output from the selector 234B-3.

In addition, in a case of 20-byte or 24-byte data, the selectors 234B-1, 234B-2, and 234B-3 are controlled such that the outputs of the CRC circuits 212-2 and 212-3 are used. In other words, the selectors are controlled such that only the output of the CRC circuit 212-4 is not used. In this case, the selector 235B is controlled such that the data corresponding to the respective sizes from the 17th byte of the data is input to the CRC circuits 211 and 212. FIG. 13 shows a state where B sides of the selector 234B-1, the selector 234B-2, the selector 234B-3, and the selector 235B are selected. The selector 231B is controlled such that the CRC circuit 211 that calculates the CRC of 4-byte (20–8×2) data is selected when the data is 20 bytes, and the CRC circuit 212 that calculates the CRC of 8-byte (24–8×2) data is selected when the data is 24 bytes.

The CRC circuit 212-2 calculates the CRC of 8-byte data from the head of the data, and adds it to the CRC stored in the memory circuit 232. In this case, the output of the CRC circuit 212-2 is output from the selector 234B-1. The CRC circuit 212-3 calculates the CRC of the 8-byte data from the 9th byte of the data, and adds it to the CRC output from the selector 234B-1. In this case, the output of the CRC circuit 212-3 is output from the selector 234B-3 via the selector 234B-2, and the CRC circuits 211 and 212 calculate the CRC of the input data and add it with the CRC output from the selector 234B-3.

In addition, in a case of 28-byte or 32-byte data, the selectors 234B-1, 234B-2, and 234B-3 are controlled such that any of the outputs of the CRC circuits 212-2, 212-3 and CRC circuit 212-4 is used. In this case, the selector 235B is controlled such that the data corresponding to the respective sizes from the 25th byte of the data is input to the CRC circuits 211 and 212. FIG. 13 shows a state where A sides of the selector 234B-1, the selector 234B-2, the selector 234B-3, and the selector 235B are selected. The selector 231B is controlled such that the CRC circuit 211 that calculates the CRC of 4-byte (28–8×3) data is selected when the data is 28 bytes, and that the CRC circuit 212 that calculates the CRC of 8-byte (32–8×3) data is selected when the data is 32 bytes.

The CRC circuit 212-2 calculates the CRC of 8-byte data from the head of the data and adds it to the CRC stored in the memory circuit 232. In this case, the output of the CRC circuit 212-2 is output from the selector 234B-1. In addition, the CRC circuit 212-3 calculates the CRC of the 8-byte data from the 9th byte of the data, and adds it to the CRC output from the selector 234B-1. In this case, the output of the CRC circuit 212-3 is output from the selector 234B-2. In addition, the CRC circuit 212-4 calculates the CRC of the 8-byte data from the 17th byte of the data, and adds it to the CRC output from the selector 234B-2. In this case, the output of the CRC circuit 212-3 is output from the selector 234B-3, and the CRC circuits 211 and 212 calculate the CRC of the input data and add it with the CRC output from the selector 234B-3.

In this way, when the bus width is 32 bytes, even if the CRC is calculated by dividing the data into 4 parts, the ECRC circuit may be configured with 1-byte, 4-byte, and 8-byte (four) CRC circuits, and the circuit area of the circuit for calculating the CRC can be reduced.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
   a storage device; and
   a controller configured to control writing of data to the storage device and reading of data from the storage device based on a request from a host device, wherein
   the controller includes a host interface unit that includes a packet protection circuit, and
   the packet protection circuit includes a plurality of first CRC calculation circuits, each configured to calculate a CRC of M-byte data, where M is an integer greater than or equal to 1 and less than N, where N is an integer greater than or equal to 2, a first selector configured to output a CRC calculation result of one of the first CRC calculation circuits, and a second CRC calculation circuit configured to calculate a CRC of L-byte data, where L<N, where L=N×Z, and Z is an integer greater than 1, and add the CRC of L-byte data to the CRC calculation result output from the first selector to generate a first CRC that is compared with a second CRC to detect an error in a data packet transmitted between the host interface unit and the host device.

2. The memory system according to claim 1, wherein the data packet is transmitted from the host device to the host interface and includes the second CRC, and the packet protection circuit compares the first CRC to the second CRC to detect the error in the data packet.

3. The memory system according to claim 1, wherein
   the data packet is transmitted from the host interface to the host device and includes the first CRC, and
   the host device calculates the second CRC and compares the first CRC to the second CRC to detect the error in the data packet.

4. The memory system according to claim 1, wherein N is 4 and L is 1.

5. The memory system according to claim 4, wherein the packet protection circuit further includes a second selector configured to output 1-byte from the data packet as an input to the second CRC calculation circuit.

6. The memory system according to claim 5, wherein the first CRC calculation circuits include a first circuit configured to calculate a CRC of 4-byte data, a second circuit configured to calculate a CRC of 8-byte data, a third circuit configured to calculate a CRC of 12-byte data, and an eighth circuit configured to calculate a CRC of 16-byte data.

7. The memory system according to claim 6, wherein the packet protection circuit further includes:
a third CRC calculation circuit configured to calculate a CRC of a first half of the data packet, wherein
each of the first CRC calculation circuits calculates a CRC of M-byte data from a second half of the data packet, and adds the CRC of M-byte data to the CRC of the first half of the data packet output by the third CRC calculation circuit to generate the CRC calculation result thereof.

8. The memory system according to claim 6, wherein the first CRC calculation circuits further include a fourth circuit configured to calculate a CRC of 16-byte data, a fifth circuit configured to calculate a CRC of 20-byte data, a sixth circuit configured to calculate a CRC of 24-byte data, a seventh circuit configured to calculate a CRC of 28-byte data, and a ninth circuit configured to calculate a CRC of 32-byte data.

9. The memory system according to claim 8, wherein the packet protection circuit further includes:
a third CRC calculation circuit configured to calculate a CRC of a first half of the data packet, wherein
each of the first CRC calculation circuits calculates a CRC of M-byte data from a second half of the data packet, and adds the CRC of M-byte data to the CRC of the first half of the data packet output by the third CRC calculation circuit to generate the CRC calculation result thereof.

10. The memory system according to claim 1, wherein the packet protection circuit further includes a memory circuit configured to store an intermediate CRC result output from the first selector, and
each of the first CRC calculation circuits adds the CRC of M-byte data to the intermediate CRC result stored in the memory circuit to generate the CRC calculation result thereof.

11. A memory system comprising:
a storage device; and
a controller configured to control writing of data to the storage device and reading of data from the storage device based on a request from a host device, wherein
the controller includes a host interface unit that includes a packet protection circuit, and
the packet protection circuit includes
a memory circuit configured to store an initial or interim CRC value;
a first CRC calculation circuit configured to calculate a CRC of 4-byte data from the 4-byte data and the CRC value stored in the memory circuit;
a second CRC calculation circuit configured to calculate a CRC of 8-byte data from the 8-byte data and the CRC value stored in the memory circuit;
a first selector configured to output a CRC calculation result of one of the first and second CRC calculation circuits and the CRC value stored in the memory circuit; and
a third CRC calculation circuit configured to calculate a CRC of 1-byte data, and add the CRC of 1-byte data to the CRC calculation result or value output from the first selector to generate a first CRC that is compared with a second CRC to detect an error in a data packet transmitted between the host interface unit and the host device.

12. The memory system according to claim 11, wherein the packet protection circuit further includes a second selector configured to output 1-byte from the data packet as an input to the second CRC calculation circuit, and
the 1-byte data from the data packet is a fourth byte from a tail of the data packet, and the 4-byte data includes fifth through eighth bytes from the tail of the data packet.

13. The memory system according to claim 12, wherein the packet protection circuit further includes a third CRC calculation circuit configured to calculate a CRC of 8-byte data that includes ninth through sixteenth bytes from the tail of the data packet, wherein
the first CRC calculation circuit adds the CRC of 4-byte data calculated thereby to the CRC calculation result output by the third CRC calculation circuit to generate the CRC calculation result of the first CRC calculation circuit, and
the second CRC calculation circuit adds the CRC of 8-byte data calculated thereby to the CRC calculation result output by the third CRC calculation circuit to generate the CRC calculation result of the second CRC calculation circuit.

14. The memory system according to claim 13, wherein the packet protection circuit further includes a fourth CRC calculation circuit configured to calculate a CRC of 8-byte data that includes 17th through 24th bytes from the tail of the data packet, wherein
the third CRC calculation circuit adds the CRC of 8-byte data calculated thereby to the CRC calculation result output by the fourth CRC calculation circuit to generate the CRC calculation result of the third CRC calculation circuit.

15. The memory system according to claim 14, wherein the packet protection circuit further includes a fifth CRC calculation circuit configured to calculate a CRC of 8-byte data that includes 25th through 32nd bytes from the tail of the data packet, wherein
the fourth CRC calculation circuit adds the CRC of 8-byte data calculated thereby to the CRC calculation result output by the fifth CRC calculation circuit to generate the CRC calculation result of the fourth CRC calculation circuit.

16. A method of generating a CRC of a data packet transmitted between a memory system and a host device, said method comprising:
calculating in parallel a first CRC value based on a CRC of 4-byte data, a second CRC value based on a CRC of 8-byte data, and a third CRC value based on a CRC of 12-byte data, wherein the 4-byte data, the 8-byte data, and the 12-byte data includes fifth through eighth bytes, fifth through twelfth bytes, and fifth through sixteenth bytes, respectively, from a tail of the data packet;
selecting one of the first CRC value, the second CRC value, the third CRC value, an initial CRC value, and an intermediate CRC value;
calculating a fourth CRC value based on a CRC of 1-byte data that is a fourth byte from the tail of the data packet; and
combining the fourth CRC value with the selected CRC value to generate the CRC of the data packet.

17. The method according to claim 16, further comprising:
storing the generated CRC of the data packet in the data packet.

18. The method according to claim 16, further comprising:
   storing an interim CRC value; and
   the first, second, and third CRC values are calculated based on a combination of the interim CRC value and a respective one of the CRC of 4-byte data, the CRC of 8-byte data, and the CRC of 8-byte data.

19. The method according to claim 16, further comprising:
   calculating a fifth CRC value based on a CRC of a first half of the data packet, wherein
   the first, second, and third CRC values are calculated based on a combination of the fifth CRC value and a respective one of the CRC of 4-byte data, the CRC of 8-byte data, and the CRC of 8-byte data.

20. The method according to claim 19, wherein the data packet has a size of 32 or 64 bytes.

\* \* \* \* \*